US010636867B2

United States Patent
Cai et al.

(10) Patent No.: US 10,636,867 B2
(45) Date of Patent: Apr. 28, 2020

(54) METAL-INSULATOR-POLY CAPACITOR IN A HIGH-K METAL GATE PROCESS AND METHOD OF MANUFACTURING

(71) Applicant: GLOBALFOUNDRIES Singapore Pte. Ltd., Singapore (SG)

(72) Inventors: Xinshu Cai, Singapore (SG); Shyue Seng Tan, Singapore (SG); Juan Boon Tan, Singapore (SG); Danny Pak-Chum Shum, Caspian (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/032,896

(22) Filed: Jul. 11, 2018

(65) Prior Publication Data
US 2020/0020761 A1 Jan. 16, 2020

(51) Int. Cl.
*H01L 29/66* (2006.01)
*H01L 27/06* (2006.01)
*H01L 27/32* (2006.01)
*H01L 49/02* (2006.01)
*H01L 27/07* (2006.01)

(52) U.S. Cl.
CPC .......... *H01L 28/60* (2013.01); *H01L 27/0629* (2013.01); *H01L 27/0711* (2013.01); *H01L 27/3265* (2013.01); *H01L 29/66545* (2013.01); *H01L 29/66871* (2013.01)

(58) Field of Classification Search
CPC . H01L 27/02; H01L 27/0203; H01L 27/3265; H01L 27/11517; H01L 27/0629; H01L 28/60; H01L 28/40; H01L 29/66545; H01L 29/42324
See application file for complete search history.

(56) References Cited

U.S. PATENT DOCUMENTS

| 5,751,037 A | * | 5/1998 | Aozasa | H01L 21/28282 257/315 |
| 6,274,435 B1 | | 8/2001 | Chen | |
| 9,184,252 B2 | | 11/2015 | Chuang et al. | |
| 9,570,539 B2 | | 2/2017 | Chuang et al. | |
| 9,698,241 B1 | * | 7/2017 | Patil | H01L 29/66545 |
| 2006/0227622 A1 | * | 10/2006 | Ogura | G11C 16/0475 365/185.29 |
| 2013/0264634 A1 | * | 10/2013 | Hall | H01L 27/04 257/326 |
| 2014/0084387 A1 | * | 3/2014 | Dewey | H01L 29/0665 257/410 |

(Continued)

FOREIGN PATENT DOCUMENTS

EP 1359606 A2 11/2003

*Primary Examiner* — Galina G Yushina
(74) *Attorney, Agent, or Firm* — Ditthavong & Steiner P.C.

(57) ABSTRACT

A method of forming an integrated circuit with a metal-insulator-poly (MIP) capacitor formed in a high-k metal gate (HKMG) process and the resulting device are provided. Embodiments include a device including a metal gate; a high-k dielectric layer formed around side walls of the metal gate, and a dummy polysilicon gate adjacent to at least one portion of the high-k dielectric layer. The device also includes a capacitor including the HK layer as an insulator, wherein the insulator is between a dummy as one electrode and the metal gate as another electrode.

10 Claims, 6 Drawing Sheets

(56) References Cited

U.S. PATENT DOCUMENTS

| | | | |
|---|---|---|---|
| 2015/0318291 A1* | 11/2015 | Liu | H01L 27/11521 |
| | | | 257/316 |
| 2016/0064398 A1* | 3/2016 | Toh | H01L 27/11524 |
| | | | 257/316 |
| 2016/0093508 A1* | 3/2016 | Ogawa | C23C 16/455 |
| | | | 438/476 |
| 2016/0225846 A1 | 8/2016 | Chuang et al. | |

* cited by examiner

METAL-INSULATOR-POLY CAPACITOR IN A HIGH-K METAL GATE PROCESS AND METHOD OF MANUFACTURING

TECHNICAL FIELD

The present disclosure relates to devices with a metal-insulator-poly (MIP) capacitor formed in a high-k metal gate (HKMG) process, and methods of manufacturing thereof. The present disclosure is applicable to 28 nanometer (nm) technology nodes and beyond.

BACKGROUND

The Metal-Insulator-Metal (MIM) capacitor is a key passive component in radio frequency (RF) integrated circuits, due to its high capacitance density that supplies a small area, increases circuit density, and reduces fabrication costs. A metal line as a bottom plate of the MIM capacitor may be a metallic film (e.g., titanium nitride, or titanium nitride). A capacitor dielectric layer of the MIM capacitor may be a silicon oxide layer, e.g., a silicon oxide layer deposited by chemical vapor deposition (CVD), as to a thickness of between about 350 and about 500 Angstroms. A top plate of the MIM capacitor may be deposited by CVD over the silicon oxide layer, to a thickness of 180 to 200 Angstroms may be a top plate of the MIM capacitor. In this example, the capacitance density F is approximately 0.6 $fF/\mu m^2$. It is desired to have an increased capacitance density, such as a capacitance density in the range of about 5 $fF/\mu m^2$ to about 15 $fF/\mu m^2$.

Such a MIM capacitor typically requires a lengthy development time and requires three masks for advanced node such as 7 nm nodes. Moreover, the MIM capacitor is not applicable for high voltage (e.g., 5V) applications due to its thinner insulator film thickness at the backend.

A need therefore exists for a capacitor which can sustain high voltage to enable high-performance capacitor integration for high-frequency applications, especially in the integration scheme of forming a HKMG for both metal-oxide semiconductor (CMOS) and fin-type field-effect transistor (FinFET) devices. A need also exists for a method of manufacturing such a capacitor requiring less processing steps and less time.

SUMMARY

An aspect of the present disclosure is a device including a MIP capacitor formed with a HKMG process.

Another aspect of the present disclosure is a device including an array of MIP capacitors formed with a HKMG process.

Another aspect of the present disclosure is a method for forming a device including a MIP capacitor or an array of MIP capacitors over a substrate with a HKMG process.

Another aspect of the present disclosure is a method for forming a device including a MIP capacitor or an array of MIP capacitors over a shallow trench isolation (STI) region with a HKMG process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including a metal gate, a high-k dielectric layer formed around side walls of the metal gate, and a dummy polysilicon gate adjacent to at least one portion of the high-k dielectric layer.

Another aspect of the present disclosure is a device including a plurality of metal gates, each having a high-k dielectric layer formed around its side walls. A dummy polysilicon gate is formed adjacent to at least a portion of the high-k dielectric layer. A plurality of capacitors is provided and each of the capacitors is formed between a pair of the metal gates, each of the capacitors includes the high-k dielectric layer as an insulator, wherein the insulator is between the polysilicon gate as one electrode and the metal gate as another electrode.

A further aspect of the present disclosure is a method including: forming a dummy polysilicon gate above a substrate, forming an interlayer dielectric (ILD) over the dummy polysilicon gate and the substrate, removing a portion of the dummy polysilicon gate to form a groove, forming a high-k dielectric layer in the groove, and filling the groove with a metal over the high-k dielectric layer as a metal gate of a transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of MIM capacitors in integrated circuits. The problems are solved, inter alia, by forming a MIP capacitor in a HKMG process. Methodology in accordance with embodiments of the present disclosure includes forming a device including a metal gate formed above a substrate and a HK layer, wherein the high-k dielectric layer is formed around side walls of the metal gate, and a capacitor including the high-k dielectric layer as an insulator, wherein the insulator is sandwiched between a preserved dummy gate as one electrode and the metal gate as another electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
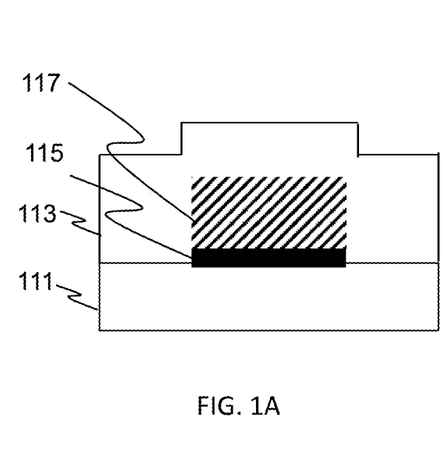
FIGS. 1A, 1C, 1E, 1G and 1I schematically illustrate sequential steps of a method of forming a MIP capacitor over a substrate in a replacement metal gate (RMG) process, in accordance with an exemplary embodiment.
Figure 1B:
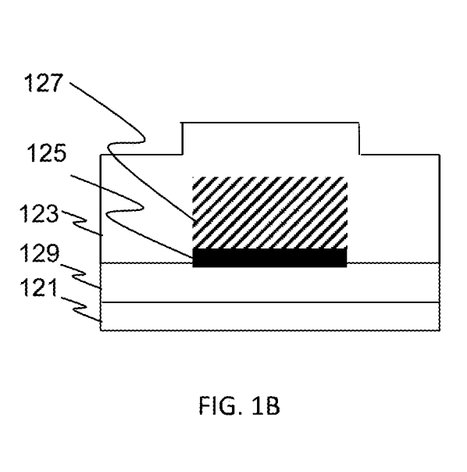
FIGS. 1B, 1D, 1F, 1H and 1J schematically illustrate sequential steps of a method of forming a MIP capacitor over a shallow trench isolation (STI) region in a RMG process, in accordance with an exemplary embodiment.
Figure 1C:
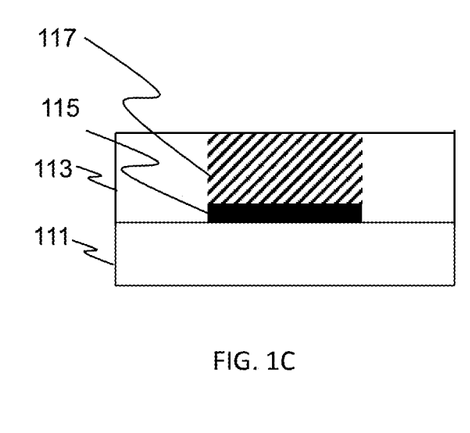

FIGS. 1A, 1C, 1E, 1G and 1I schematically illustrate sequential steps of a method of forming a metal-insulator-poly (MIP) capacitor over a substrate in a RMG process in accordance with an aspect of the present disclosure. As shown in FIG. 1A, a dummy gate oxide 115 and a poly/dummy 117 are formed on substrate 111. An interlayer dielectric (ILD) 113 is formed (e.g., deposited) over poly/dummy gate 117. As illustrated in FIG. 1C, extra ILD 113 is removed via chemical mechanical planarization (CMP). Dummy gate oxide 115' can be e.g., silicon dioxide ($SiO_2$), aluminum oxide ($Al_2O_3$), hafnium oxide ($HfO_2$), silicon oxynitride (SiON), silicon-carbon-boron-nitrogen (SiCBN), silicon-carbon-oxynitride (SiCON), silicon carbon nitride (SiCN), or silicon boron nitride (SiBN). Dummy polysilicon gate 117 may be formed of polysilicon as at a thickness of about 400 Å to about 600 Å.

A dummy poly gate in accordance with an exemplary embodiment is provided during the manufacturing process of a transistor to define a space of a gate of the transistor via self-alignment, yet is partially preserved around side walls of the gate in the transistor. As shown in FIG. 1E, a portion of dummy gate oxide 115 and a part of dummy poly gate 117 are removed (e.g., via etching). In FIG. 1G, a high-k dielectric layer 131 and a silicon ($\alpha$-Si) 133 are added over the structure including the remaining portion of dummy gate oxide 115' and the remaining portion of poly/dummy gate 117'. High-k dielectric layer 131 may include silicon nitride (SiN), silicon-oxynitrite (SiOxNy), hafnium oxide (HfO), hafnium silicon oxide (HfSiO), hafnium aluminum oxide (HfAlO), or hafnium tantalum oxide (HMO). High-k dielectric layer 131 is formed around side walls of the poly/dummy gate 117'.

Figure 1D:
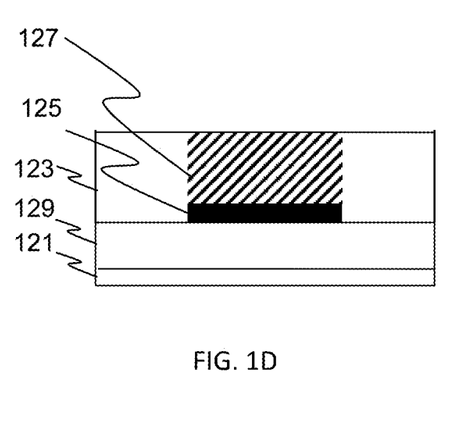
Figure 1E:
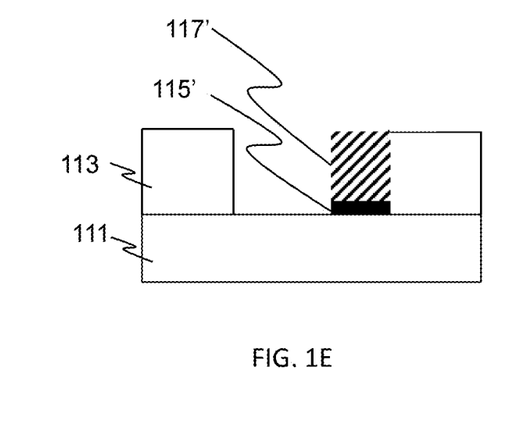
Figure 1F:
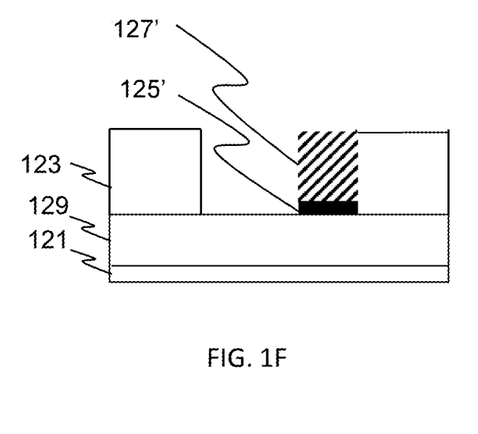
Figure 1G:
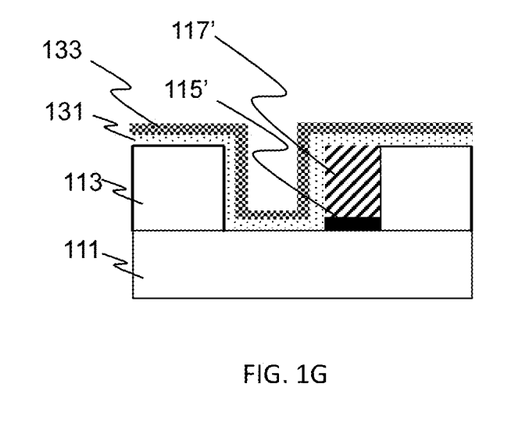
Figure 1H:
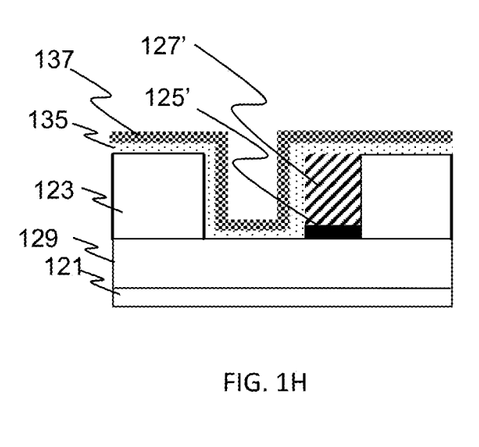
Figure 1I:
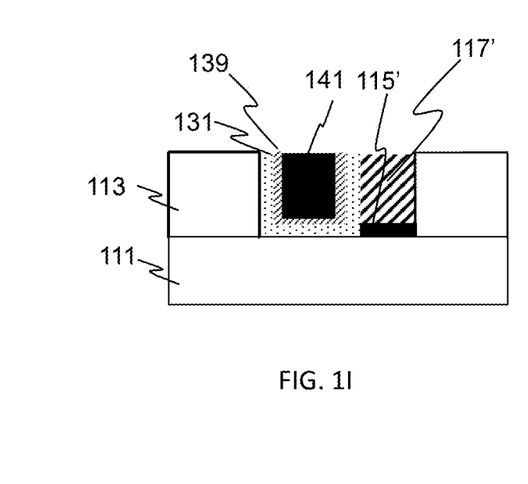

As shown in FIG. 1I, $\alpha$-Si 133 is removed, for example, via wet etch by $H_3PO_4$ and a work function (WF) layer 139 (as at a thickness of about 5 Å to about 10 Å) is formed, as by deposition, over HK layer 131, which may have a dielectric constant greater than 3.9. In one example, the WF layer 139 may be a metal material or any other suitable material. A metal gate 141 is deposited over WF layer 139 (with the remaining portion of dummy gate oxide 115' and the remaining portion of dummy polysilicon gate 117' thereunder). The resulting MIP capacitor contains HK layer 131 as an insulator (as at a thickness of about 10 Å to about 40 Å) between metal gate 141 (as an electrode of a thickness of 400 Å to 600 Å) and the remaining portion of dummy poly gate 117' (as another electrode of a thickness of 400 Å to 600 Å). The width of the remaining portion of poly/dummy gate 117' may be 0.03 µm to 0.06 µm, the width of HK layer 131 may be 10 Å to 40 Å, the width of WF layer 139 may be 5 Å to 10 Å, and the width of metal gate 141 may be 0.03 µm to 0.06 µm in parallel with substrate 111. The thickness of the remaining portion of the poly/dummy gate 117' and a thickness of the metal gate 141 can range from 400 Å to 600 Å perpendicular to substrate 111. The resulting MIP capacitor has a capacitance density in the range of 5 $fF/\mu m^2$ to about 15 $fF/\mu m^2$.

Such a MIP capacitor is applicable for high voltage (e.g., 5V) applications if the dielectric between the Metal gate and dummy poly is re-using the thicker OX ranging from 100 Å~200 Å, which is available in process with High voltage devices.

FIGS. 1B, 1D, 1F, 1H and 1J schematically illustrate sequential steps of a method of forming a metal-insulator-poly (MIP) capacitor over a STI region in a RMG process in accordance with another aspect of the present disclosure. FIGS. 1B, 1D, 1F, 1H and 1J are the same as FIGS. 1A, 1C, 1E, 1G and 1I, except that an MIP capacitor is formed above a shallow trench isolation (STI) region 129 instead of above a substrate 121. As shown in FIG. 1B, dummy gate oxide 125 and poly/dummy 127 are formed on substrate 121. An interlayer dielectric (ILD) 123 is formed (e.g., deposited) over poly/dummy gate 127. As shown in FIG. 1D, extra ILD 123 is removed, as by chemical mechanical planarization (CMP).

Figure 1J:
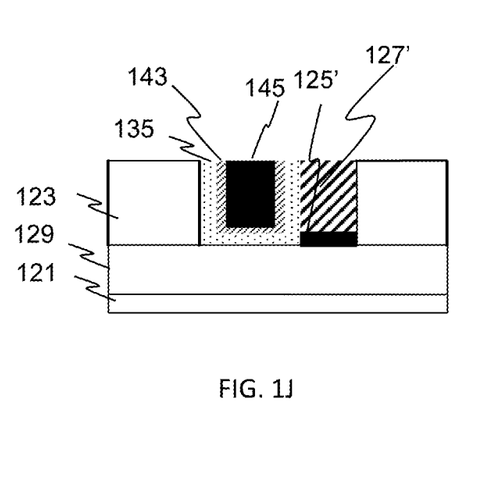

As shown in FIG. 1F, a portion of dummy gate oxide 125 and a portion of poly/dummy gate 127 are removed (e.g., via etching). In FIG. 1H, HK layer 135 and a silicon ($\alpha$-Si) 137 are added (e.g., via annealing) over structure 121 (including the remaining portion of dummy gate oxide 125' and the remaining portion of poly/dummy gate 127' there under). As shown in FIG. 1J, $\alpha$-Si 137 is removed, as via chemical mechanical planarization, and a work function (WF) metal 143 is deposited over HK layer 135. Metal gate 145 is deposited over WF layer 143 (with the remaining portion of dummy gate oxide 125' and the remaining portion of poly/dummy gate 127' thereunder). The resulting MIP capacitor includes HK layer 135 as an insulator between metal gate 145 (as one electrode) and the remaining portion of dummy poly gate 127' (as another electrode).

Figures 2A, 2B:
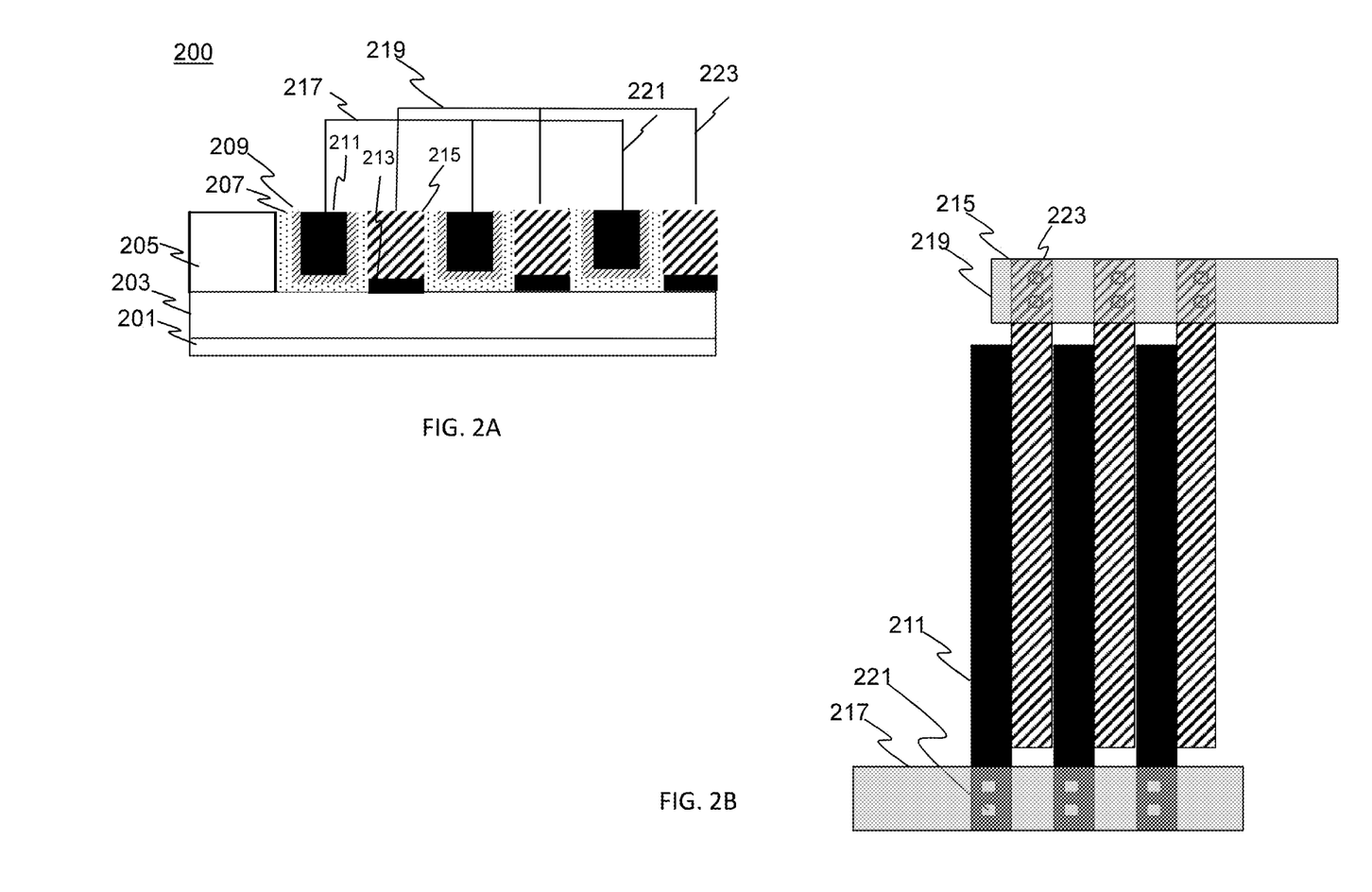
FIG. 2A schematically illustrates a cross-sectional view of an MIP capacitor array, in accordance with an exemplary embodiment.
FIG. 2B schematically illustrates a top view of the MIP capacitor array depicted in FIG. 2A, in accordance with an exemplary embodiment.

FIG. 2A schematically illustrates a cross-sectional view of an MIP capacitor array, in accordance with an exemplary embodiment. MIP capacitor array 200 includes a plurality of MIP capacitors (e.g., three) arranged to improve device density. A shallow trench isolation (STI) region 203 is formed on substrate 201. An interlayer dielectric (ILD) 205 and three sets of HKMG/MIP structures are formed over shallow trench isolation (STI) region 203. Each HKMG includes HK layer 207, a WF layer 209, and a metal gate 211. Each MIP capacitor includes metal gate 211, HK layer 207, and poly/dummy gate 215. Dummy gate oxide 213 remains between poly/dummy gate 215 and STI 203. Each metal gate 211 is connected to a conductive layer 217 via one or more through holes 221, while each poly/dummy gate 215 is connected to a conductive layer 219 via one or more through holes 223. FIG. 2B schematically illustrates a top view of the MIP capacitor array depicted in FIG. 2A.

The embodiments of the present disclosure are capable of achieving several technical effects, such as a capacitance density in the range of 5 $fF/\mu m^2$ to about 15 $fF/\mu m^2$. In addition, MIP capacitors in accordance with embodiments of the present disclosure require shorter development time and fewer masks for advanced nodes, such as 7 nm nodes, than conventional MIM capacitors. Moreover, MIP capacitors in accordance with embodiments of the present disclosure are suitable for high voltage (e.g., 5V) applications by re-using thick oxide available in process with High voltage devices. Embodiments of the present disclosure enjoy utility in various industrial applications as, for example, microprocessors, smartphones, mobile phones, cellular handsets, set-top boxes, DVD recorders and players, automotive navigation, printers and peripherals, networking and telecom equipment, gaming systems, and digital cameras. The present disclosure is particularly applicable to 28 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a metal gate;
   a high-k dielectric layer formed around side walls of the metal gate, and
   a portion of a dummy polysilicon gate adjacent to at least one portion of the high-k dielectric layer,
   wherein the portion of the dummy polysilicon gate is preserved in a replacement metal gate process of forming the metal gate.

2. The device according to claim 1, further comprising a capacitor that includes a portion of the high-k dielectric layer as an insulator.

3. The device according to claim 2, wherein the insulator is between the portion of the dummy polysilicon gate as one electrode and the metal gate as another electrode.

4. The device according to claim 2, wherein the capacitor has a capacitance density in the range of 5 $fF/\mu m^2$ to 15 $fF/\mu m^2$.

5. The device according to claim 1, wherein the portion of the dummy polysilicon gate has a width of 0.03 μm to 0.06 μm in parallel with a substrate.

6. The device according to claim 5, wherein the metal gate has a width of 0.03 μm to 0.06 μm in parallel with the substrate.

7. The device according to claim 5, wherein the high-k dielectric layer has a thickness of 10 Å to 40 Å in parallel with the substrate.

8. The device according to claim 3, further comprising a work function metal layer formed between the metal gate and the high-k dielectric layer.

9. The device according to claim 8, wherein the work function metal layer is formed as a part of the other electrode of the capacitor.

10. The device according to claim 8, wherein the work function metal layer has a thickness of 5 Å to 10 Å in parallel with the substrate.

* * * * *